(12) United States Patent
Cai

(10) Patent No.: US 7,050,777 B2
(45) Date of Patent: May 23, 2006

(54) METHODS AND CIRCUITRY FOR REDUCING INTERMODULATION IN INTEGRATED TRANSCEIVERS

(75) Inventor: Yijun Cai, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 780 days.

(21) Appl. No.: 10/037,897

(22) Filed: Oct. 22, 2001

(65) Prior Publication Data

US 2003/0078022 A1    Apr. 24, 2003

(51) Int. Cl.
*H04B 1/10* (2006.01)

(52) U.S. Cl. .................................................. 455/295

(58) Field of Classification Search ........ 375/371–376; 331/46, 2, 16; 455/86–87, 236.1, 255, 208–209, 455/259, 264, 265, 295, 204
See application file for complete search history.

(56) References Cited

U.S. PATENT DOCUMENTS

| 4,763,085 A | 8/1988 | Lamberg |
| 4,864,574 A | 9/1989 | Pritt |
| 6,163,684 A | 12/2000 | Birleson |

OTHER PUBLICATIONS

Heng-Chia Chang, 'Analysis of Oscillators with External Feedback Loop for Improved Locking Range and noise Reduction', Aug. 1999, IEEE Transactions on Microwave Theory and Techniques, vol. 47, No. 8, pp. 1535-1542.*
European Search Report, May 21, 2003.

* cited by examiner

*Primary Examiner*—Wing Chan
*Assistant Examiner*—Alexander Jamal

(57) ABSTRACT

Methods and circuitry reduce adverse impacts of intermodulation and optimize performance of integrated circuits that include two or more oscillator circuits on the same chip. In one embodiment, intermodulation between voltage-controlled oscillators (VCOs) in the receiver and transmitter paths of a transceiver is reduced by adjusting relative power of the VCOs and/or bandwidths of the phase-locked loops (PLLs). The invention measures the injection lock frequency range of the VCOs based on which transmitter and receiver VCO power and loop bandwidths are adjusted.

26 Claims, 6 Drawing Sheets

METHODS AND CIRCUITRY FOR REDUCING INTERMODULATION IN INTEGRATED TRANSCEIVERS

BACKGROUND OF THE INVENTION

The present invention relates in general to the field of high-speed telecommunications, and in particular to integrated transceivers that include a voltage-controlled oscillator (VCO) in the transmitter and another VCO in the receiver portion of the transceiver.

A single integrated circuit acting as a transceiver combines both a transmitter and a receiver on a single die. Such an integrated circuit has the advantages of reducing the communication system cost and providing easier diagnostic loop-back functions. A phase-locked loop (PLL) is an extremely useful system that is commonly used in a number of different applications and especially in communication systems. The heart of a PLL is a voltage-controlled oscillator (VCO) whose ideal output is a periodic signal the frequency of which is controlled by an input voltage.

In the context of a transceiver, analog PLL technology has been used for both transmitter and receiver circuits due to its superior performance in terms of jitter and overall accuracy. Typically, a transmitter transmits data using a clock signal that is locked to an output frequency of a local reference clock generated by, e.g., a local crystal. Thus, to recover the data, a receiver must lock to the frequency of the remote transmitter from which it receives its data. In an integrated transceiver that includes both a transmitter and a receiver on the same substrate, the VCO of the receiver locks to the frequency of a remote oscillator, while the VCO of the transmitter locks to the frequency of a local oscillator. Often the local and remote oscillators run at slightly different frequencies. Crosstalk between the two PLLs that run at different frequencies causes intermodulation which will degrade the transceiver's performance. Intermodulation refers to the condition in which one VCO tracks not only its own reference frequency but the frequency of the other VCO. There are a number different sources for crosstalk and other types of noise in an integrated transceiver that give rise to intermodulation. These include crosstalk through the common substrate, coupling through the power supply, or coupling caused by radiation. For example, both the jitter characteristic of the receiver and the jitter characteristic of the transmitter are affected by the undesirable crosstalk between the transmitter and receiver that occurs when the transmitter and receiver are placed on the same integrated circuit. For very high-speed applications, the degradation of the jitter performance of the transceiver caused by intermodulation can cause either the transmitter, receiver, or both to be unable to meet the specification.

As is apparent from the above discussion, there is a need for a reducing the undesirable effects of intermodulation that occurs when operating a single-die transceiver.

BRIEF SUMMARY OF THE INVENTION

Conventional integrated transceivers which include more than one voltage-controlled oscillator on the integrated circuit suffer from the problem that undesirable coupling through a variety of mechanisms causes intermodulation, thereby degrading the performance of the integrated circuit. The present invention provides methods and circuitry that reduce adverse impacts of intermodulation and optimize performance of integrated circuits that include two or more oscillator circuits on the same chip. In one embodiment, intermodulation is reduced in a transceiver device that includes a transmitter and a receiver on the same chip. The invention adjusts the relative power ratio of the receiver VCO and the transmitter VCO, or adjusts the relative loop bandwidths of the receiver and transmitter PLLs, or a combination of both to minimize intermodulation.

According to a specific embodiment of the invention, the injection lock frequency range of one VCO and its power when operating in a free running mode are first measured. Based on the injection lock frequency range and the free running power of the VCO, the invention then determines the amount of crosstalk power (or injection power). This information is used along with the loop bandwidth of each PLL to adjust the relative power and bandwidth ratios in the receiver and the transmitter to minimize intermodulation. This is achieved, according to a specific embodiment of the invention first locking a first PLL (transmitter or receiver) to a reference, while the second PLL is opened so that its VCO is free running. When the reference frequency of the first PLL is close enough to the free running VCO frequency of the second PLL (i.e., within the injection lock frequency range), the free running VCO will be injection locked to the first PLL due to the various crosstalk mechanisms. By measuring the injection lock frequency range $\Delta\omega_m$, the amount of crosstalk signal power $P_i$ can be determined by an equation that includes the free-run frequency $\omega_o$, the que (Q) of the loop filter (LC tank), and the free-run VCO power $P_o$. When the second PLL is closed and locked to another reference which frequency is slightly different from the first one, intermodulation between the two phase-locked loops will occur. The modulation index is determined by both the PLL bandwidth and the free run VCO injection lock range, which mainly depends on the power ratio $P_i/P_o$. By properly utilizing the trade off between PLL loop bandwidth and the VCO power ratio, the invention minimizes undesirable intermodulation.

Accordingly, in one embodiment, the present invention provides a method of reducing intermodulation between a first VCO in a first PLL and a second VCO in a second PLL, including: measuring an injection lock frequency range of the second VCO with respect to the first VCO; measuring a signal power of the second VCO; determining a crosstalk power between the first and the second VCOs using the measured injection lock frequency range and the measured signal power of the second VCO; and adjusting a signal power ratio between the first VCO and the second VCO to reduce intermodulation.

In another embodiment, the present invention provides a method for measuring an injection lock frequency range for an integrated circuit having a first VCO and a second VCO. The method includes: applying a control voltage to an input of the second VCO such that an output frequency of the second VCO locks to an output frequency of the first VCO; controlling the output frequency of the first VCO until the output frequency of the second VCO falls out of lock with the output frequency of the first VCO; and measuring the frequency range within which the second VCO frequency remains in lock with the first VCO frequency. The varying of the output frequency of the first VCO is, in a specific embodiment, accomplished by switching of the input of the second VCO from an output of a low pass filter to a control signal to which the control voltage is applied. For example, the locking of the second VCO can be accomplished by monotonically increasing the control voltage to the input of the second VCO until the output frequency of the second VCO locks to the output frequency of the first VCO. In a yet more specific embodiment, a switch decouples the input of the first VCO from the output of the loop filter and connects it to another control voltage, which is changed in order to affect the output frequency of the first voltage-controlled oscillator. Alternatively, the output frequency of the first VCO can be varied by changing the frequency of an input stream to the first PLL.

In another embodiment, the present invention provides a method of computing an injection signal power within a voltage-controlled oscillator on an integrated circuit. The method includes: determining an injection lock frequency range of the voltage-controlled oscillator, determining a que of an LC tank within a voltage-controlled oscillator, determining a free-run frequency of the voltage-controlled oscillator, determining a free-run output power of the voltage-controlled oscillator, and calculating an injection signal power value proportional to a product of a square of the injection lock frequency range, a square of the que, and the free-run output power of the voltage-controlled oscillator divided by a square of the free-run output frequency of the voltage-controlled oscillator. In order to execute this method of computing the injection signal power according to the present invention, the determination of the injection lock frequency range can be accomplished by the measurement method described above.

According to yet another embodiment of the present invention, an injection lock frequency range is reduced by a method involving the steps of measuring an injection lock frequency range of the second voltage-controlled oscillator, and increasing a free-run output power of the second voltage-controlled oscillator. The step of measuring the injection lock frequency range of the second voltage-controlled oscillator can be accomplished by the method described above. In addition, according to this aspect of the present invention, the step of increasing the free-run output power of the second voltage-controlled oscillator is accomplished by increasing a signal amplitude of the second voltage-controlled oscillator. Because the crosstalk from the second voltage-controlled oscillator to the first voltage-controlled oscillator increases when the output power of the second voltage-controlled oscillator is increased, a compensation to the first phase-locked loop must be performed if it is desired not to degrade the performance of the first phase-locked loop. Thus, according to the present invention, the loop bandwidth of the first phase-locked loop is increased in order to compensate for the increase in output power of the second voltage-controlled oscillator.

These and other features, aspects, and advantages of the present invention will be apparent from the Detailed Description of the Invention, which is read in conjunction with the Figures.

BRIEF DESCRIPTION OF THE DRAWINGS

In the Figures, like parts are referenced with like reference numerals. The Figures are more fully explained in the Detailed Description of the Invention.

DETAILED DESCRIPTION OF THE INVENTION

Figure 1:
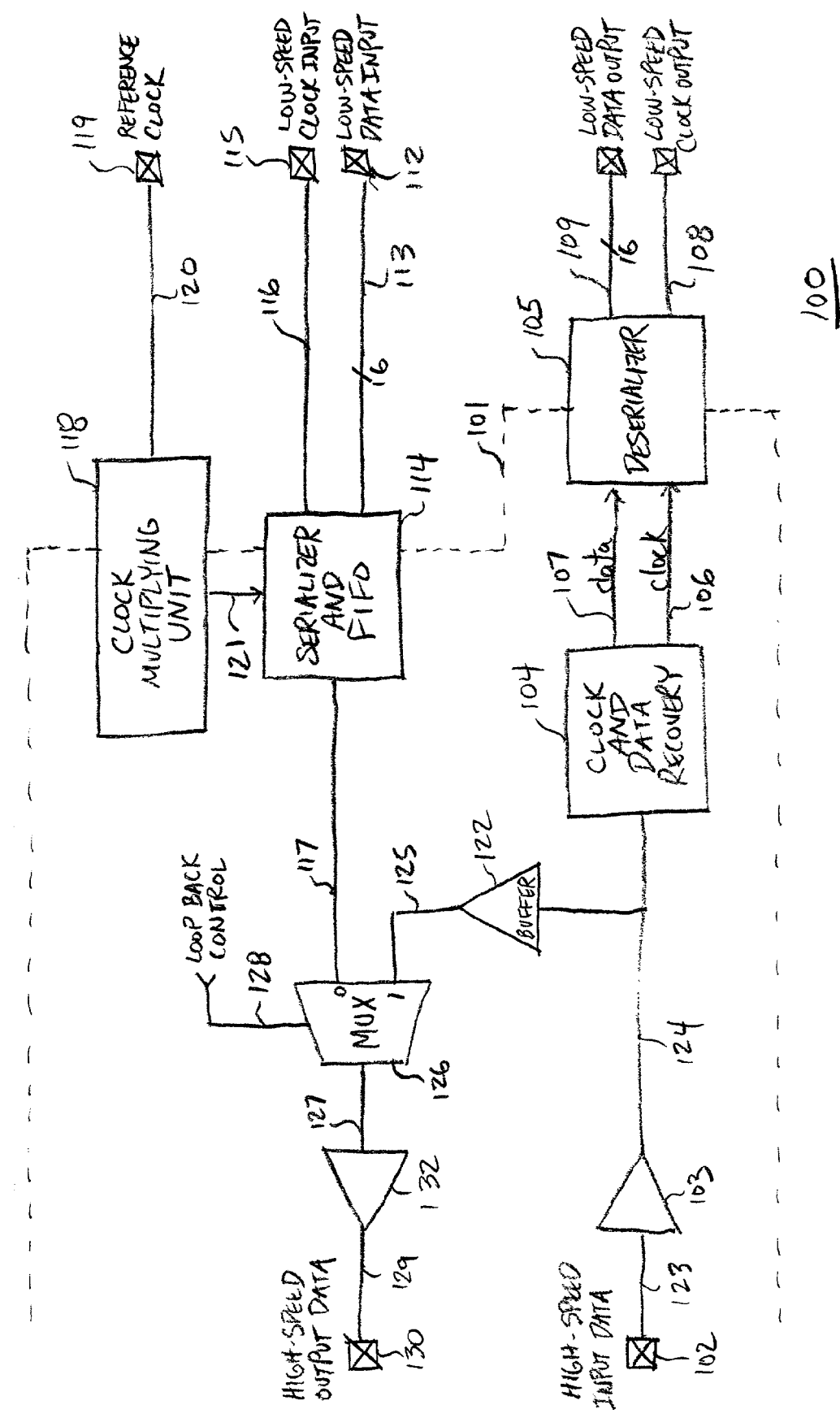
FIG. 1 illustrates a transceiver architecture in which the methods according to the present invention can be executed.

Since intermodulation through the various cross-talk mechanisms exists whenever two VCOs are fabricated on the same integrated circuit, regardless of the circuit context, the methods according to the present invention can be applied to any circuit configuration in which two VCOs are fabricated on the same die. For illustrative purposes only, the present invention is described in the context of an integrated communications transceiver that includes one VCO in the transmitter and another in the receiver. Specifically, the VCOs are part of phase-locked loops within a transmitter and receiver. In one exemplary embodiment described herein, the PLL having a VCO within the receiver is part of a clock and data recovery (CDR) unit, and the PLL having a VCO within the transmitter is part of the clock multiplying unit (CMU).

The transceiver includes a transmitter and a receiver. The receiver portion of the transceiver includes a clock and data recovery (CDR) unit which recovers the high speed clock and data from the serial input signal. The clock and data recovery unit has a phase-locked loop for locking onto the frequency of the high speed input stream. The transmitter portion of the transceiver includes a clock multiplying unit (CMU) for generating a high speed clock from a locally generated low speed reference clock. Normally both the receiver and the transmitter have their own phase-locked loops. The reference clock phase-locked loop is normally referenced to a local crystal generated reference frequency $f_2$. In asynchronous mode, the data phase-locked loop locks to the frequency $f_1$ of the data coming in from the communication link, which could be a fiber. The offset between the local crystal generated reference frequency $f_2$ and the remote generated frequency $f_1$ coming in from the data on the communication link is typically on the order of 40 to 100 to 400 parts per million.

The clock and data recovery circuit in the receiver and the clock multiplying unit in the transmitter each have phase-locked loops. A phase-locked loop has a phase detector, a low pass filter, and a voltage-controlled oscillator (VCO). The phase-locked loop may or may not include a frequency divider in the feed back loop. The phase-locked loop in the clock multiplying unit of the transmitter includes a frequency divider so that the phase frequency detector can compare a low speed derivative of the high speed clock to the low speed reference clock from the local oscillator. The phase-locked loop in the clock and data recovery portion of the receiver does not include a frequency divider because the input data is at high speed. The transmitter phase-locked loop locks to frequency $f_2$ generated by the oscillator, while the receiver phase-locked loop locks to frequency $f_1$ from the received data.

Whenever there are two voltage-controlled oscillators on the same chip, the two voltage-controlled oscillators are going to have some cross coupling because they are on the same die. The tuning range of a voltage-controlled oscillator in the range of 10 GHz is fairly wide, for example, 1 GHz, meaning that the output of the VCOs can vary by 500 MHz on each side. Because the two frequencies $f_1$ and $f_2$ are, even in the worst case, very close to one another in terms of the dynamic range of the VCOs, the small signal gain of the two VCOs is essentially the same.

The crosstalk between the two VCOs causes an angular modulation of the original reference clock and thus degrades the jitter performance of the transmitter. According to the present invention, a design methodology results in reduction of the angular modulation and therefore superior jitter performance. As a first part of the design methodology, the amount of coupling or crosstalk is quantitatively measured. In order to measure the crosstalk, one of the phase-locked loops is broken, for example by a switch, such as the reference clock phase-locked loop in the clock multiplying unit. Then a voltage is applied to the input of the VCO in the broken loop, so that the VCO in that loop runs at a frequency very close to the frequency $f_1$ in the phase-locked loop in the clock and data recovery unit. For a range of frequencies around the frequency $f_1$ of the phase-locked loop in the clock and data recovery unit, the VCO of the open phase-locked loop will lock to the same frequency $f_1$ of the closed phase-locked loop. This locking occurs as a result of injection from the other closed loop through the crosstalk mechanisms inherent in having the two phase-locked loops on the same die. Essentially, a parasitic phase-locked is created for the VCO in the open loop through the crosstalk mechanisms. The crosstalk mechanisms include coupling of the circuit through the substrate, coupling through the power supply, emitted radiation, or a variety of other sources. Once locking of the open loop VCO to the frequency $f_1$ of the closed loop (i.e., injection lock) has occurred, the frequency $f_2$ of the VCO in the open loop will track the frequency $f_1$ of the closed loop for a range of frequencies $f_1$.

Once locking of the open loop VCO has occurred, the frequency f1 of the data source in the closed loop is varied until the VCO in the open loop loses lock. By measuring the upper limit and lower limit of the frequencies for which the VCO in the open loop remains locked to the frequency $f_1$ in the closed loop, the injection lock frequency range $\Delta\omega_o$ is obtained.

FIG. 1 illustrates a specific implementation of a transceiver 100 in which the methods according to the present invention may be used. All of the high speed circuitry (to the left of dotted line 101) and lower speed parallel circuitry (to the right of dotted line 101) is integrated onto a single integrated circuit 100. Inside the integrated circuit 100, the input pad 102 generates a high-speed input signal 123 that feeds a high-speed input receiver 103. The output of the high speed input receiver 103 is a single signal 124 that has both clock and data encoded on it. A clock and data recovery unit (CDR) 104 receives the output 124 of the input receiver 103 and extracts the high frequency clock 106 and the high frequency data 107 and sends them to a deserializer 105 which converts the serial high frequency clock 106 and data 107 into a lower frequency clock signal 108 and a lower frequency parallel data signal 109. For example, the high speed clock 106 is preferably nearly 10 GHz and the serial data 107 is at nearly 10 GHz. The lower speed parallel data 109 is then typically 16 lines at 622 MHz, with a low-speed clock 108 also at 622 MHz. Output pads 110 and 111 communicate the low speed clock output 108 and low speed data outputs 109 to other circuitry.

A sixteen to one conversion ratio is very typical. The transmitter is very similar to the receiver. Through low speed data input pads 112, sixteen parallel low speed bits 113 are transmitted from an outside source to the serializer and first in first out buffer (FIFO) 114. Through a low speed clock pad 115 a low speed clock signal 116 is transmitted to the serializer and FIFO 114. The serializer 114 takes, for example, sixteen data signals at 622 MHz and creates one high speed 10 GHz signal 117. The clock multiplying unit CMU 118 receives a reference clock signal 120 from an input pad 119 driven, for example, by an external oscillator (not shown). The reference clock signal 120 is, for example, at 17 MHz below speed and is multiplied up in order to generate a 10 GHz reference clock signal output 121.

Figure 2:
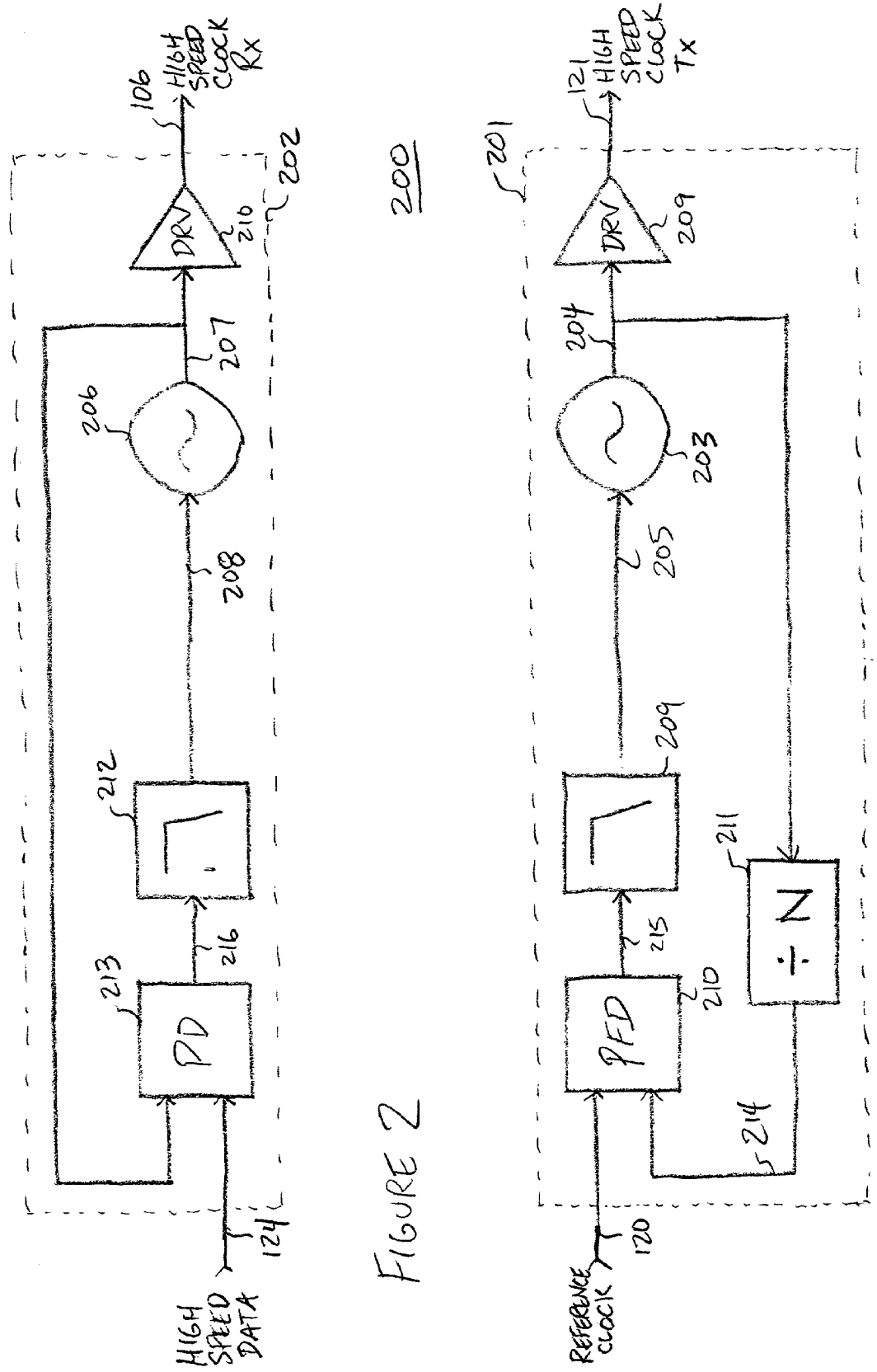
FIG. 2 illustrates the phase-locked loops within the receiver and transmitter of a transceiver according to the present invention.

FIG. 2 illustrates the two phase-locked loops 200 within the transceiver 100 illustrated in FIG. 1. In the context of the exemplary embodiment described herein, the phase-locked loop 201 as part of the clock and multiplying unit 118 and phase-locked loop 202 as part of the clock and data recovery unit 202 coexist on the same die. Phase-locked loop 201 includes voltage-controlled oscillator 203 whose output 204 has a frequency w0 which is determined by the signal at the control input 205. The input 205 of the voltage-controlled oscillator is typically a direct current voltage and controls the output frequency of the voltage-controlled oscillator 203 in a monotonic fashion. A driver 209 amplifies the output 204 of the voltage-controlled oscillator 203 to produce the high speed clock transmitter signal 121 which is sent to the serializer and FIFO 114. The output 204 of the voltage-controlled oscillator 203 is fed back through a clock divider circuit 211 which generates a low speed clock feedback signal 214 that is synchronized with the reference clock 120. A phase frequency detector 210 compares the low speed clock 214 with the reference clock 120 to produce a signal 215 that is then filtered by low pass filter 209 in order to produce the voltage-controlled oscillator control signal 205.

Phase-locked loop 202 includes voltage-controlled oscillator 206 whose output 207 has a frequency $\omega_o$ which is determined by the control voltage at the input terminal 208. The input 208 of the voltage-controlled oscillator is typically a direct current voltage and influences the output frequency of the voltage-controlled oscillator 206 in a monotonic fashion. A driver 210 amplifies the output 207 of the voltage-controlled oscillator 206 to produce the high speed clock transmitter signal 106 which is sent to the deserializer 105. The output 207 of the voltage-controlled oscillator 206 is fed back to a phase detector 213 that compares the output 207 to the high speed input data 124. The phase detector 213 produces a signal 216 that is filtered through the low pass filter 212 to produce the direct current voltage 208 that is the input to the voltage-controlled oscillator 206.

Figure 3:
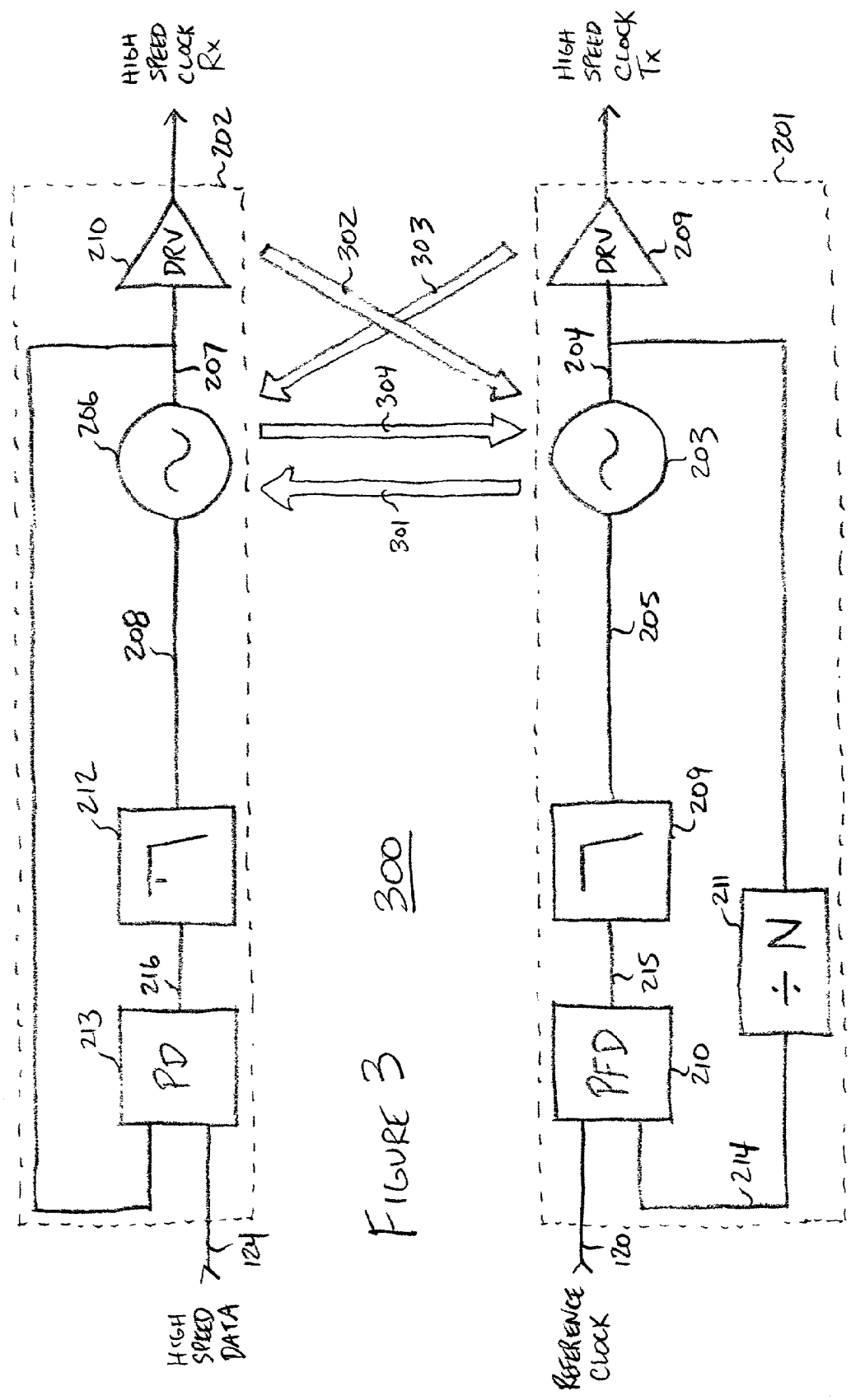
FIG. 3 illustrates crosstalk that occurs within the phase-locked loops of the receiver and transmitter of a transceiver of FIG. 2.

FIG. 3 illustrates the interference that occurs between the two phase-locked loops 201 and 202. Specifically, crosstalk 301 from voltage-controlled oscillator 203 to voltage-controlled oscillator 206 and crosstalk 304 from voltage-controlled oscillator 206 to voltage-controlled oscillator 203 occurs through a variety of crosstalk mechanisms, such as through the substrate coupling, power supply, and radiation through the air. In addition, crosstalk 302 from the output of the driver 302 to the input of the voltage-controlled oscillator 203, and crosstalk 303 from the output of the driver 209 to the input of the voltage-controlled oscillator 206 occurs through the same mechanisms as crosstalk 301 and 304. The crosstalk between the two phase-locked loops is described by the coupling coefficients x and y, as shown in the following equations (1) and (2).

$$P_{iCDR} = x*P_{0CMU} + y*P_{drvCMU} \quad \text{(Equation 1)}$$

$$P_{iCMU} = x*P_{0CDR} + y*P_{drvCDR} \quad \text{(Equation 2)}$$

$P_{iCDR}$ and $P_{0CDR}$ are the injection power and free-run power for the receiver VCO used in the CDR unit, respectively, $P_{iCMU}$ and $P_{0CMU}$ are the injection power and free-run power for the transmitter VCO used in the CMU block, respectively, and $P_{drvCMU}$ and $P_{drvCDR}$ are the signal powers for the transmitter driver and the receiver driver, respectively.

Figure 4:
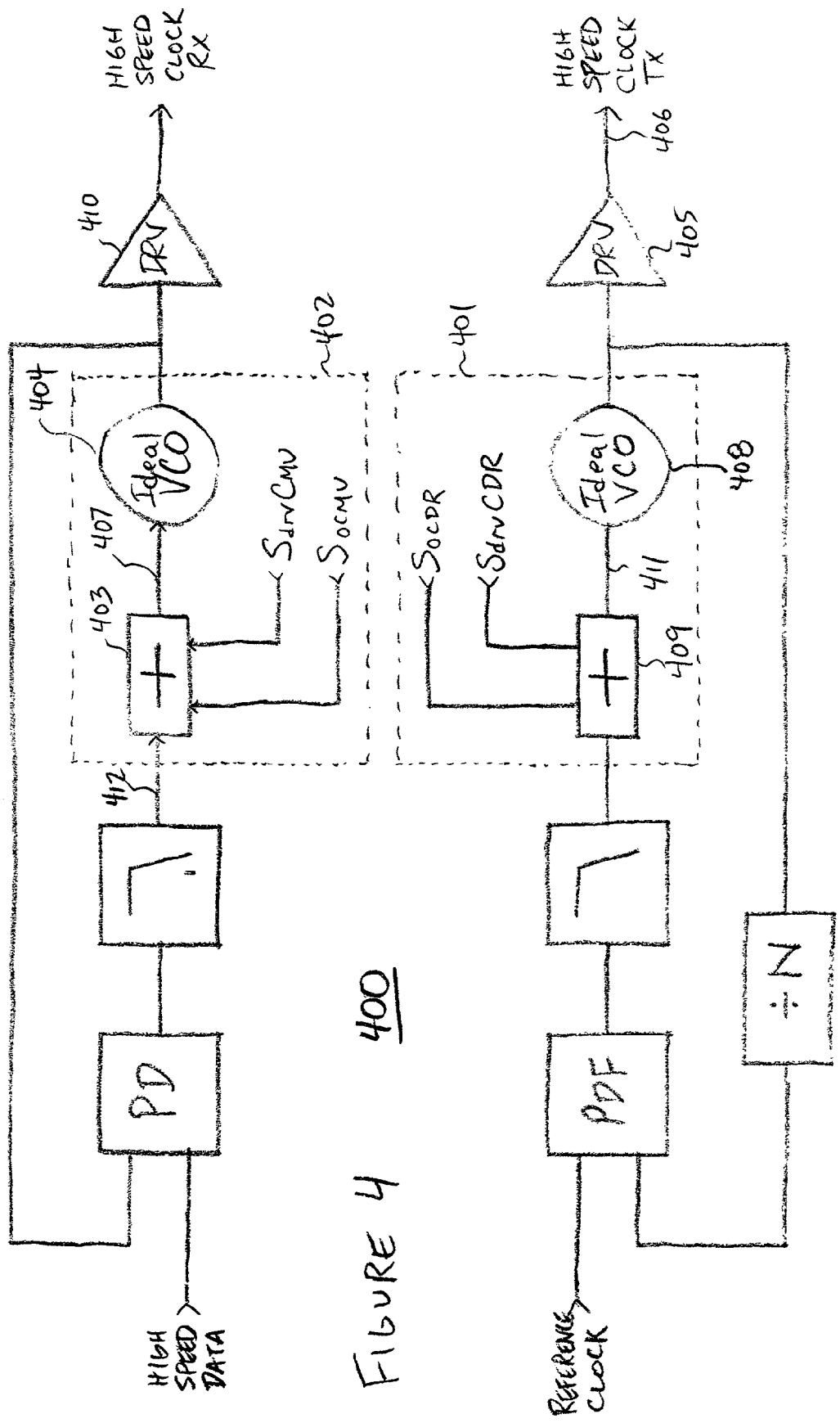
FIG. 4 depicts a circuit model of the phase-locked loops within a receiver and transmitter of a transceiver that models the real voltage-controlled oscillators that are affected by the crosstalk mechanisms with ideal elements that model the crosstalk mechanisms with ideal circuit elements and signals.

FIG. 4 illustrates the circuit equivalent 400 of the two phase-locked loops 201 and 202 and the crosstalk mechanisms 301-304 illustrated in FIG. 3 that exist when the phase-locked loops are implemented on the same integrated circuit. The ideal circuit elements within the dotted box 401 model the parasitic crosstalk mechanisms that affect the real voltage-controlled oscillator 203 in the clock multiplying unit of the transmitter shown in FIG. 3; and the ideal circuit elements within the dotted box 402 model the parasitic crosstalk mechanisms that affect the real voltage-controlled oscillator 206 in the clock and data recovery unit of the receiver shown in FIG. 3. In other words, the dotted box 401 models with ideal elements the real voltage-controlled oscillator 203 shown in FIG. 2, and the dotted box 402 models with ideal elements the real voltage-controlled oscillator 206 shown in FIG. 2.

Specifically, adder 403 represents the various undesirable parasitic cross coupling mechanisms 301 and 303 shown in FIG. 3 that affect the output of the ideal voltage-controlled oscillator 404 in the clock and data recovery unit phase-locked loop. A signal $S_{drvCMU}$ is injected from the driver 405 of the transmitter high speed clock signal 406 into the input signal 407 of the voltage-controlled oscillator 404 through the parasitic cross coupling mechanisms 303 shown in FIG. 3. A signal $S_{0CMU}$ is injected from the voltage-controlled oscillator 408 into the input signal 407 of the ideal voltage-controlled oscillator 404 through the parasitic cross coupling mechanisms 301. Adder 409 represents the various parasitic cross coupling mechanisms 302 and 304 shown in FIG. 3 that affect the ideal voltage-controlled oscillator 408 in the clock multiplying unit phase-locked loop 401. A signal $S_{drvCDR}$ is injected from the driver 410 into the input signal 411 of the voltage-controlled oscillator 408 through the cross-talk mechanisms 302 illustrated in FIG. 3. A signal $S_{0CDR}$ is injected from the voltage-controlled oscillator 404 into the input signal 411 of the voltage-controlled oscillator 408 through the parasitic cross coupling mechanisms 304 illustrated in FIG. 3. Thus, low pass filter output signal 412 is degraded by signals $S_{drvCMU}$ and $S_{0CMU}$. Similarly, low pass filter output signal 413 is degraded by signals $S_{drvCDR}$ and $S_{0CDR}$.

When the two voltage-controlled oscillators are running at slightly different frequencies, inter-modulation occurs. The magnitude of the inter-modulation is dependent on the phase-locked loop bandwidth and the power ratio of injected signal and the voltage-controlled oscillator input signal, which can be characterized by an injection lock range described by the following equation (3).

$$\Delta \omega_m := \frac{\omega_0}{Q} \sqrt{\frac{P_i}{P_o}} \quad \text{(Equation 3)}$$

Where Q is the resonant frequency and provides a figure of merit with regard to the quality of the oscillator. The oscillator typically includes an inductor-capacitor (LC) tank circuit. For higher levels of Q, the voltage-controlled oscillator has better capabilities of rejecting noise.

Figure 5:
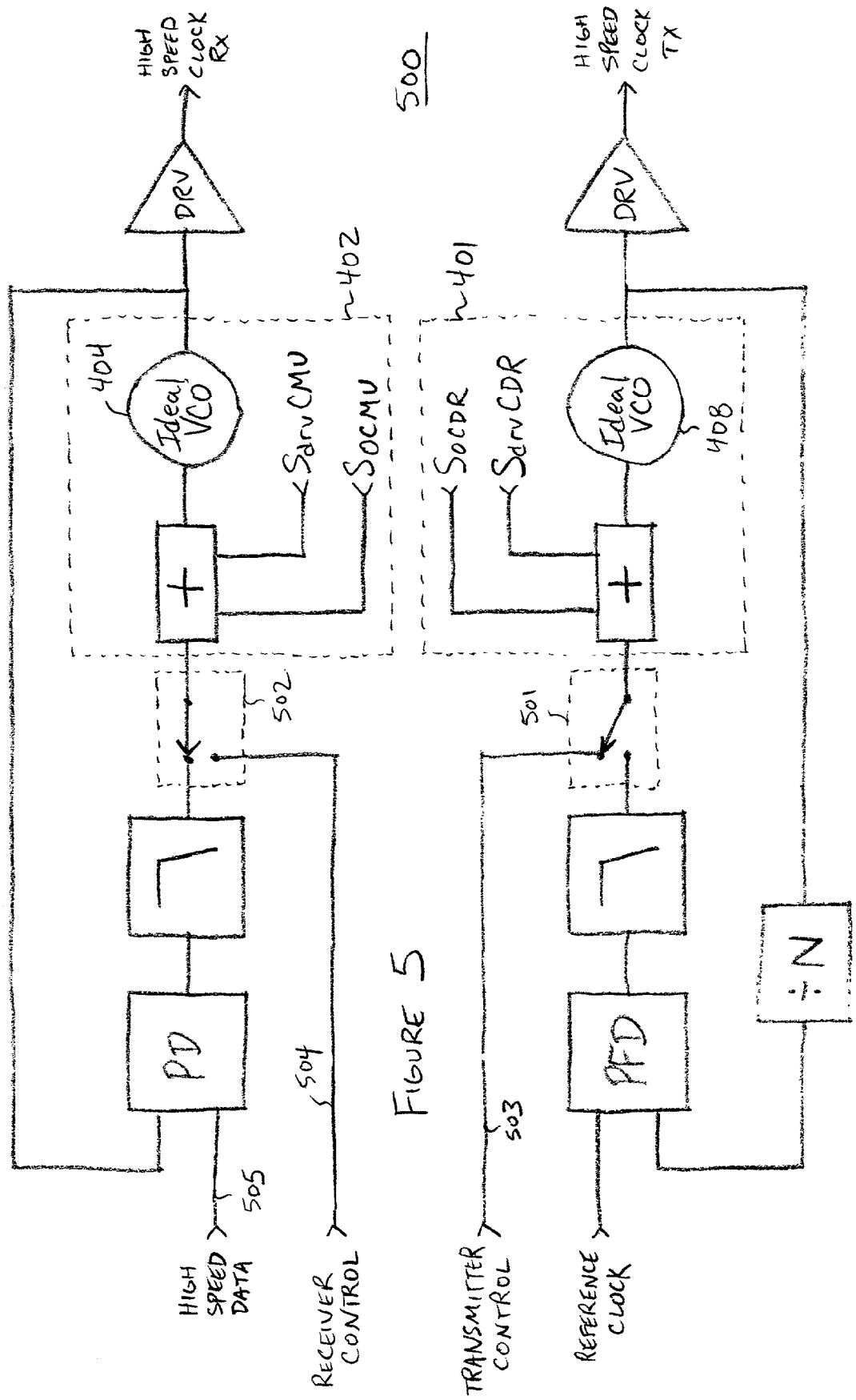
FIG. 5 depicts a circuit model of ideal elements including switch elements in the phase-locked loops so as to provide the capability to provide a control signal to the voltage-controlled oscillator within the clock multiplying unit of the transmitter of the transceiver in accordance with the methods of the present invention.

FIG. 5 illustrates a circuit model 500 suitable for carrying out the methods of the present invention. Specifically, according to the present invention, switches 501 and 502 are used to provide the capability to open the feedback loops so that the inputs to the voltage-controlled oscillators can be driven by external control signals. As shown in FIG. 5, switch 501 is first opened so that the input to the real voltage-controlled oscillator 401 is connected to a transmitter control signal 503. The amount of intermodulation can be measured by varying the frequency of the voltage-controlled oscillator 402 in the receiver phase-locked loop once the voltage-controlled oscillator 401 and voltage-controlled oscillator 402 are locked to one another. In one embodiment, the varying of the frequency of the voltage-controlled oscillator 402 is accomplished as followed. The switch 502 is closed as shown in FIG. 5 so that the phase-locked loop in the receiver is locked to the frequency of an incoming high speed data signal 505. In this embodiment, the frequency of the voltage-controlled oscillator 402 is varied by changing the frequency of the incoming high speed data stream 505 to which the voltage-controlled oscillator 402 is locked. In an alternative embodiment according to the present invention, the switch 502 is opened to break the loop and controlled so that the input to the voltage-controlled oscillator 402 is connected to an external (to the loop) receiver control signal 504. The control signal 504 which may be supplied externally to the chip, is increased or decreased in order to vary the frequency of the voltage-controlled oscillator 402. The injection lock frequency range is measured by varying the frequency of the voltage-controlled oscillator 402 while the transmitter control signal 503 is held at a constant level. At some point, the voltage-controlled oscillator 401 in the transmitter will lose lock with the voltage-controlled oscillator 402 in the receiver. For a given voltage at the transmitter control signal 503, the upper and lower limits of the frequency of the voltage-controlled oscillator 402 for which the voltage-controlled oscillator 401 will remain locked to the voltage-controlled oscillator 402 within the receiver can be measured according to the present invention, so that the injection lock frequency range can be determined by the difference of the upper and lower limits.

Figure 6:
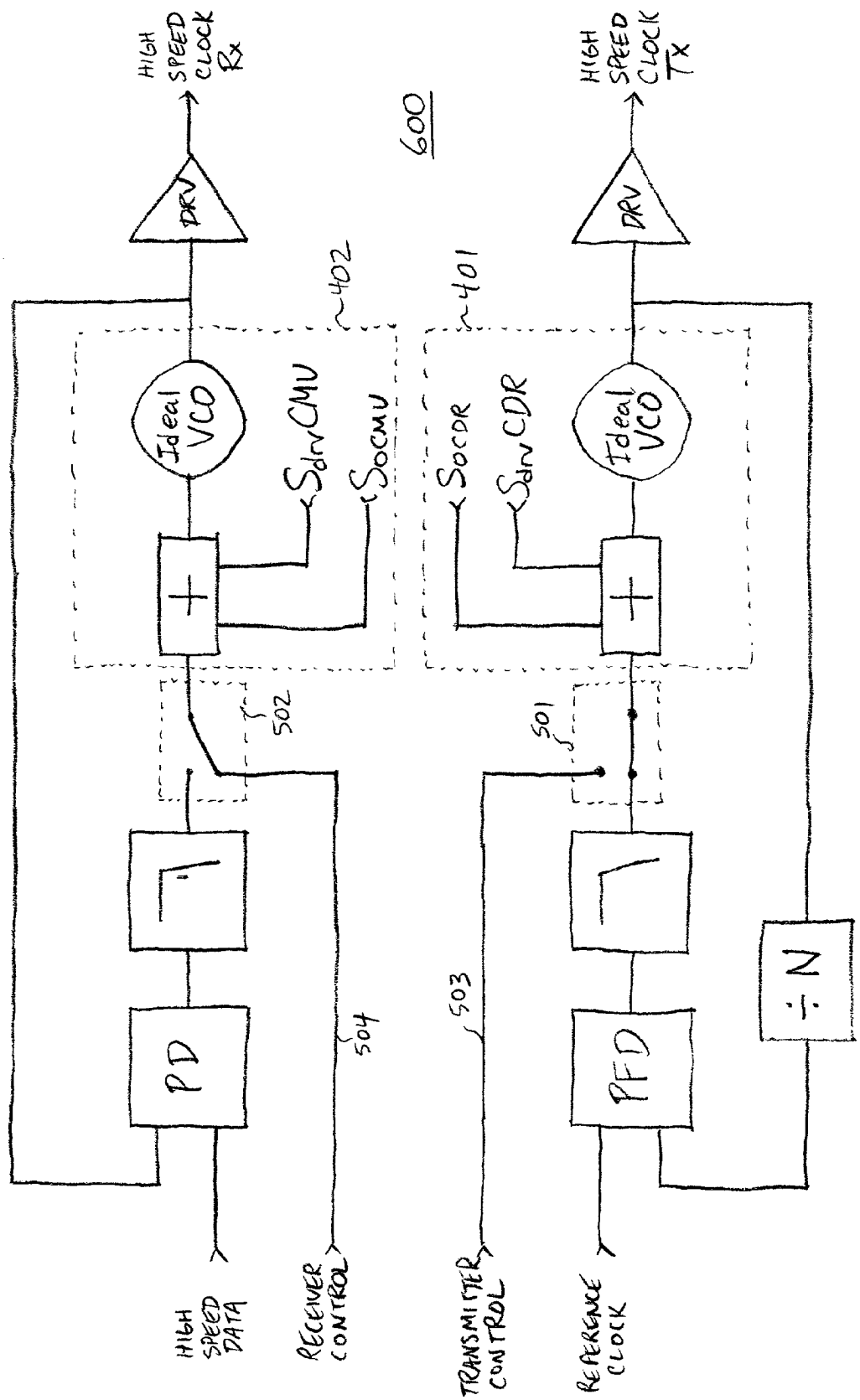
FIG. 6 depicts another circuit model of ideal elements including switch elements in the phase-locked loops so as to provide the capability to provide a control signal to the voltage-controlled oscillator within the clock and data recovery unit of the receiver in accordance with the methods of the present invention.

FIG. 6 illustrates another circuit model 600 according to the present invention suitable for carrying out the methods according to the present invention. The switch 502 in the receiver is opened so that the input to the voltage-controlled oscillator 402 can be connected to a receiver control signal 504 that controls the output frequency of the voltage-controlled oscillator 402 in the receiver. Once the output frequency of the voltage-controlled oscillator 402 in the receiver has locked to the output frequency of the voltage-controlled oscillator 401 in the transmitter phase-locked loop, then the frequency of the voltage-controlled oscillator 401 in the transmitter can be varied until the output frequency of the voltage-controlled oscillator 402 loses lock with the output frequency of the voltage-controlled oscillator 401 in the receiver. For a given voltage of the receiver control signal 504 that operates the voltage-controlled oscillator 402 near its free-run frequency, the upper and lower limit of the frequency of the voltage-controlled oscillator 401 for which the frequency of the voltage-controlled oscillator 402 will remain locked to the frequency of the voltage-controlled oscillator 401 can be measured.

The bandwidth of a PLL is used to characterize the ability of the PLL to track the incoming reference signal. Similarly, the injection lock range (which responds to a parasitic PLL) can be used to measure the ability of the VCO to track the injection signal. When the crosstalk occurs, the VCO attempts to track the frequencies of both the reference and the crosstalk signal. This leads to intermodulation. Thus, the impact of intermodulation can be minimized by either increasing the phase-locked loop bandwidth or by decreasing the injection lock frequency range. According to equation 3, the injection lock range can be reduced by increasing the voltage-controlled oscillator power $P_O$ over the injected power $P_i$. In the exemplary transceiver described herein, a higher phase-locked loop bandwidth for the receiver is desirable for jitter tolerance requirements, as long as the data feed through does not cause any problems. It is therefore preferable in this embodiment to increase the loop bandwidth of the receiver PLL to minimize crosstalk and intermodulation. For the transmitter, the upper limit of phase-locked loop bandwidth is mainly constrained by the jitter transfer requirement, making reduction in injection lock range the preferred approach. In a conventional analog phase-locked loop based transceiver, the same voltage-controlled oscillator is often used for both transmitter and receiver. Thus, increasing the voltage-controlled oscillator power does not help to reduce the modulation due to the crosstalk. The approach according to the present invention uses different voltage-controlled oscillator for transmitter and receiver, and allows for individual fine tuning of the PLL performances as described above. That is, in the context of the exemplary transceiver described herein, for the receiver, a low power VCO wide band phase-locked loop is used. While the transmitter uses a high power VCO with a phase-locked loop having a relatively lower bandwidth. So both transmitter and receiver can have acceptable levels of modulation. It is to be understood that this combination may vary depending on specific implementations and application requirements.

Equation (3) can be used to calculate the injected signal power $P_{iCDR}$ into the voltage-controlled oscillator 402 of the clock and data recovery unit from the known and measured parameters of the voltage-controlled oscillator 402. Similarly, the injected signal power $P_{iCMU}$ into the voltage-controlled oscillator 401 of the clock multiplying unit can be calculated from the injection lock frequency range $\Delta\omega_m$, free-run frequency $\omega_o$, and from the known and measured parameters of the voltage-controlled oscillator 401. In performing these calculations, $P_{iCDR}$ or $P_{iCMU}$ are substituted into equation (3) for the values of $P_1$, and $P_{OCDR}$ or $P_{OCMU}$ are substituted for the values of $P_O$. Similarly, the value of $P_O$ can be calculated with the above equation (3). Once the injected signal power values $P_{iCDR}$ and $P_{iCMU}$ are calculated, their values can be substituted into the above equations (1) and (2) to compute the actual values of the cross coupling coefficients x and y.

In order to minimize $\Delta\omega_m$ for one of the loops, the output power $P_O$ of the voltage-controlled oscillator in that loop is increased by increasing the amplitude of the output of the voltage-controlled oscillator. The voltage-controlled oscillators are typically designed such that the amplitude of their outputs are controllable. The output power of the voltage-controlled oscillator is increased until the specification for the integrated circuit is safely satisfied.

According to the present invention, the impact of intermodulation can be reduced by either increasing the loop bandwidth or by increasing the voltage-controlled oscillator output power. However, normally, the loop bandwidth is part of the specification of the circuit. It is common, for example, that the loop bandwidth of a transmitter is constrained by jitter transfer specifications. Such specifications might require the loop bandwidth not to exceed, for example, four megahertz. Therefore, when the loop bandwidth becomes too high, the voltage-controlled oscillator output power can be change to optimize performance.

However, when integrated with a transmitter, the jitter bandwidth of the receiver is not as important. This allows the designer to increase the PLL loop bandwidth as long as the reference feed through does not become too large. In an embodiment that places no constraint on the jitter bandwidth, the transceiver is constructed by fixing the transmitter bandwidth and then increasing the power of the transmitter voltage-controlled oscillator. However, increasing the power of the transmitter voltage-controlled oscillator degrades the receiver. In order to compensate for the degradation of the receiver caused by the increase in power of the transmitter, the loop bandwidth of the receiver is increased. In this fashion, both the transmitter and the receiver are improved, however by different mechanisms. The transmitter is improved by increasing the power of the transmitter voltage-controlled oscillator, and the receiver is improved by increasing the loop band width. In a simple example, the loop band width is changed by adjusting the resistor and/or capacitor values in a low pass filter circuit at the input of the voltage-controlled oscillator.

In the context of the exemplary transceiver according to the present invention, the voltage-controlled oscillator output power in the clock multiplying unit of the transmitter is increased above the level of the voltage-controlled oscillator output power in the clock and a recovery unit of the receiver; and, in addition, the loop bandwidth in the phase-locked loop of the clock and data recovery unit of the receiver is increased relative to that of the transmitter by, for example, changing the low pass filter within the phase-locked loop of the receiver. This is in contrast to conventional integrated transceiver designs wherein the output power of both phase-locked loops are designed to be identical, and similarly the loop band widths as controlled by the low pass filters within the phase-locked loops are designed to be identical.

Thus, according to a first part of the invention, a calculation involves quantitatively assessing the amount of coupling between the two phase-locked loops. A second part of the invention involves a combination of ratioing the levels of the output powers of the voltage-controlled oscillators in the two phase-locked loops, and/or ratioing the levels of the loop band widths within the two phase-locked loops. Each phase-locked loop in the transmitter and receiver has its own intrinsic loop bandwidth, and the parasitic phase-locked loops have their own loop bandwidth (represented by the injection lock range). In order to minimize the effect of the parasitic phase-locked loop, the loop bandwidths of the of the transmitters and receivers are increased relative to the loop bandwidth of the parasitic phase-locked loop incurred through the crosstalk mechanisms inherent in fabricating the receiver in transmitter on the same integrated circuit. Conversely, it is possible to make the parasitic loop bandwidths smaller while the loop bandwidths of phase-locked loops in the transmitter and receiver remain constant.

These ratioing functions can be accomplished in various ways by manipulating different parameters in the PLLs. The voltage-controlled oscillator in each loop is defined by a parameter $K_v$ that indicates the slope of the relationship between the input voltage and the output frequency of the voltage-controlled oscillator. The low pass filter in each loop has a charge pump current. The phase detector in each loop has a phase detector gain. The loop bandwidth in each phase-locked loop is a function of these parameters. One way to increase the bandwidth of the phase-locked loop, for example, is to increase the time constant of the low pass filter. The injection lock range can be reduced according to Equation (3). Usually, the VCO resonant Q is already maximized for noise reasons. Thus, the $P_i/P_o$ ration can be used for adjustments. The injection power $P_1$ can be limited by improving the on-chip isolation between the two PLLs. This can be difficult, however, when operating at very high frequencies.

The second part of the invention involves narrowing the lock range of the parasitic phase-locked loop by increasing the power of the voltage-controlled oscillator in the clock and multiplying unit. With typical process parameters, the lock range is on the order of, e.g., two hundred kilohertz. In one exemplary embodiment of the present invention, the ratio of the power output for the two voltage-controlled oscillators is on the order of, e.g., sixty to one.

While the present invention has been described with reference to various specific embodiment, those embodiments are offered by way of example, not by way of limitation. Those skilled in the art will be enabled by this disclosure to make various additions and modifications to the present invention without departing from the spirit and scope of the present invention. Accordingly, all such modifications are deemed to lie within the spirit and scope of the present invention as defined by the appended claims.

What is claimed is:

1. A method of measuring an injection lock frequency range for an integrated circuit having a first voltage-controlled oscillator and a second voltage-controlled oscillator, the method comprising the steps of:
   applying a control voltage to an input of the second voltage-controlled oscillator such that an output frequency of the second voltage-controlled oscillator locks to an output frequency of the first voltage-controlled oscillator; and
   varying the output frequency of the first voltage-controlled oscillator until the output frequency of the second voltage-controlled oscillator falls out of lock with the output frequency of the first voltage-controlled oscillator.

2. A method as in claim 1, wherein the step of applying the control voltage to the input of the second voltage-controlled oscillator involves the step of switching the input of the second voltage-controlled oscillator from an output of a low pass filter to a control signal to which the control voltage is applied.

3. A method as in claim 1, wherein the step of applying the control voltage to the input of the second voltage-controlled oscillator further involves the step of:
   monotonically changing the control voltage until the output frequency of the second voltage-controlled oscillator locks to the output frequency of the first voltage-controlled oscillator.

4. A method as in claim 1, wherein the first voltage-controlled oscillator is an element of a first phase-locked loop.

5. A method as in claim 1, wherein the step of varying the output frequency of the first voltage-controlled oscillator involves the step of:
   changing a frequency of an input stream to the first phase-locked loop.

6. A method as in claim 1, wherein the second voltage-controlled oscillator is an element of a second phase-locked loop.

7. A method of computing an injection signal power within a voltage-controlled oscillator on an integrated circuit, the method comprising the steps of:
   determining an injection lock frequency range of the voltage-controlled oscillator;
   determining a que of an LC tank within a voltage-controlled oscillator;
   determining a free-run frequency of the voltage-controlled oscillator;
   determining a free-run output power of the voltage-controlled oscillator; and
   calculating an injection signal power value proportional to a product of a square of the injection lock frequency range, a square of the que, and the free-run output power of the voltage-controlled oscillator divided by a square of the free-run output frequency of the voltage-controlled oscillator, wherein the step of determining an injection lock frequency range comprises the step of measuring an injection lock frequency range of the voltage-controlled oscillator, and wherein the step of measuring the injection lock frequency range of the voltage-controlled oscillator comprises the steps of:
   applying a control voltage to an input of the voltage-controlled oscillator such that the output frequency of the voltage-controlled oscillator locks to an output frequency of another voltage-controlled oscillator on the integrated circuit; and
   varying the output frequency of the voltage-controlled oscillator until the output frequency of the voltage-controlled oscillator falls out of lock with the other voltage-controlled oscillator.

8. A method as in claim 7, further comprising the steps of:
   wherein the step of applying the control voltage to the input of the voltage-controlled oscillator involves the step of switching the input of the voltage-controlled oscillator from an output of a low pass filter to a control signal to which the control voltage is applied.

9. A method as in claim 8, wherein the step of applying the control voltage to the input of the second voltage-controlled oscillator further involves the step of:
   monotonically changing the control voltage until the output frequency of the second voltage-controlled oscillator locks to the output frequency of the first voltage-controlled oscillator.

10. A method as in claim 7, wherein the other voltage-controlled oscillator is an element of a first phase-locked loop.

11. A method as in claim 10, wherein the step of varying the output frequency of the other voltage-controlled oscillator comprises the step of:
    changing a frequency of an input stream to the first phase-locked loop.

12. A method as in claim 11, wherein the voltage-controlled oscillator is an element of a second phase-locked loop.

13. A method of reducing an injection lock frequency range of a second voltage-controlled oscillator in an integrated circuit having first and second voltage-controlled oscillators, the method comprising the steps of:

measuring an injection lock frequency range of the second voltage controlled oscillator; and increasing a free-run output power of the second voltage-controlled oscillator, wherein the step of measuring the injection lock frequency range of the second voltage-controlled oscillator comprises the steps of:

applying a control voltage to an input of the second voltage-controlled oscillator such that an output frequency of the second voltage-controlled oscillator locks to an output frequency of the first voltage-controlled oscillator; and varying the output frequency of the first voltage-controlled oscillator until the output frequency of the second voltage-controlled oscillator falls out of lock with the output frequency of the first voltage-controlled oscillator.

14. A method as in claim 13, wherein the step of applying the control voltage to the input of the second voltage-controlled oscillator involves the step of switching the input of the second voltage-controlled oscillator from an output of a low pass filter to a control signal to which the control voltage is applied.

15. A method as in claim 14, wherein the step of applying the control voltage to the input of the second voltage-controlled oscillator further involves the step of:

monotonically changing the control voltage until the output frequency of the second voltage-controlled oscillator locks to the output frequency of the first voltage-controlled oscillator.

16. A method as in claim 13, wherein the first voltage-controlled oscillator is an element of a first phase-locked loop.

17. A method as in claim 1, wherein the step of varying the output frequency of the first voltage-controlled oscillator involves the step of:

changing a frequency of an input stream to the first phase-locked loop.

18. A method as in claim 17, wherein the second voltage-controlled oscillator is an element of a second phase-locked loop.

19. A method as in claim 13, wherein the step of increasing the free-run output power of the second voltage-controlled oscillator is accomplished by increasing a signal amplitude of the second voltage-controlled oscillator.

20. A method as in claim 13, wherein the step of increasing the free-run output power of the second voltage-controlled oscillator is accomplished by reducing a loading of an output signal of the second voltage-controlled oscillator.

21. A method as in claim 16, further comprising the step of:

increasing a loop bandwidth in the first phase-locked loop.

22. A method as in claim 21, wherein the step of increasing the loop bandwidth in the first phase-locked loop is accomplished by increasing a pass band of a loop filter within the first phase-locked loop.

23. A method of reducing intermodulation between a first voltage-controlled oscillator (VCO) in a first phase-locked loop (PLL) and a second VCO in a second PLL, comprising:

measuring an injection lock frequency range of the second VCO with respect to the first VCO;

measuring a signal power of the second VCO;

determining a crosstalk power between the first and the second VCOs using the measured injection lock frequency range and the measured signal power of the second VCO; and adjusting a signal power ratio between the first VCO and the second VCO to reduce intermodulation.

24. The method of claim 23 further comprising adjusting a loop bandwidth of the first PLL relative to that of the second PLL to reduce intermodulation.

25. The method of claim 24, wherein the first PLL is part of a transmitter and the second PLL is part of a receiver, and wherein the step of adjusting a signal power ratio comprises increasing a power of the first VCO relative to that of the second vCO.

26. The method of claim 25, wherein the step of adjusting a loop bandwidth comprises increasing a loop bandwidth of the second PLL relative to that of the first PLL.

* * * * *